United States Patent
Liu et al.

(10) Patent No.: US 10,312,365 B1
(45) Date of Patent: Jun. 4, 2019

(54) LATERALLY DIFFUSED MOSFET ON FULLY DEPLETED SOI HAVING LOW ON-RESISTANCE

(71) Applicant: Avago Technologies General IP (Singapore) Pte. Ltd., Singapore (SG)

(72) Inventors: Qing Liu, Irvine, CA (US); Akira Ito, Irvine, CA (US); Shom Surendran Ponoth, Irvine, CA (US)

(73) Assignee: Avago Technologies International Sales PTE. Limited, Singapore (SG)

( * ) Notice: Subject to any disclaimer, the term of this patent is extended or adjusted under 35 U.S.C. 154(b) by 0 days.

(21) Appl. No.: 15/887,932

(22) Filed: Feb. 2, 2018

(51) Int. Cl.
| | |
|---|---|
| *H01L 29/00* | (2006.01) |
| *H01L 21/762* | (2006.01) |
| *H01L 21/8234* | (2006.01) |
| *H01L 29/78* | (2006.01) |
| *H01L 29/06* | (2006.01) |
| *H01L 29/08* | (2006.01) |
| *H01L 29/66* | (2006.01) |
| *H01L 21/311* | (2006.01) |

(52) U.S. Cl.
CPC .... *H01L 29/7824* (2013.01); *H01L 21/31111* (2013.01); *H01L 21/76275* (2013.01); *H01L 21/76283* (2013.01); *H01L 29/0653* (2013.01); *H01L 29/0878* (2013.01); *H01L 29/0882* (2013.01); *H01L 29/66681* (2013.01)

(58) Field of Classification Search
USPC .................. 257/141, 162, E21.373, E21.668
See application file for complete search history.

(56) References Cited

U.S. PATENT DOCUMENTS

| | | | | |
|---|---|---|---|---|
| 5,650,340 | A * | 7/1997 | Burr | H01L 29/1045 257/E21.427 |
| 7,169,654 | B2 * | 1/2007 | Zia | H01L 21/76283 257/350 |
| 8,159,008 | B2 * | 4/2012 | Anderson | H01L 21/2255 257/285 |
| 9,865,607 | B1 * | 1/2018 | Liu | H01L 27/11206 |
| 9,893,157 | B1 * | 2/2018 | Feilchenfeld | H01L 29/407 |

* cited by examiner

*Primary Examiner* — An T Luu
(74) *Attorney, Agent, or Firm* — Morgan, Lewis & Bockius LLP

(57) ABSTRACT

Laterally diffused MOSFETs on fully depleted SOI are provided. A laterally diffused MOSFET includes a substrate and a first semiconductor layer disposed on the substrate. The laterally diffused MOSFET also includes a buried oxide layer disposed on the first semiconductor layer. A second semiconductor layer that comprises a first gate region, a drain region, and a source region is disposed on the buried oxide layer. The first gate region is positioned between the source and drain regions. A first shallow trench isolation is disposed between the drain region and the first semiconductor layer. A second gate region is disposed on the first semiconductor layer away from the second semiconductor layer and between the first shallow trench isolation and a second shallow trench isolation. A gate node is coupled to the first and second gate regions to apply a gate voltage to the first and second gate regions.

20 Claims, 3 Drawing Sheets

US 10,312,365 B1

LATERALLY DIFFUSED MOSFET ON FULLY DEPLETED SOI HAVING LOW ON-RESISTANCE

TECHNICAL FIELD

The present description relates generally to integrated circuits, and more particularly, to laterally diffused MOSFETs.

BACKGROUND

Laterally diffused MOSFET (LDMOS) on fully depleted SOI (FDSOI) is gaining increased attention in semiconductor industry because it requires smaller dimensions compared to bulk LDMOS. Designing an LDMOS on FDSOI may form a drain that includes a lightly doped segment. The lightly doped drain (LDD) segment provides a voltage drop from the drain to edge of the gate that can help prevent gate dielectric breakdown. Thus, the LDMOS on FDSOI may support higher breakdown voltages compared to bulk LDMOS. However, the LDD segment also adds to the resistance of the LDMOS in on-state (on-resistance) which can be an issue in applications where fast turn on of the LDMOS is required. Therefore, providing an LDMOS on FDSOI with low resistance in on-state is highly desirable.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
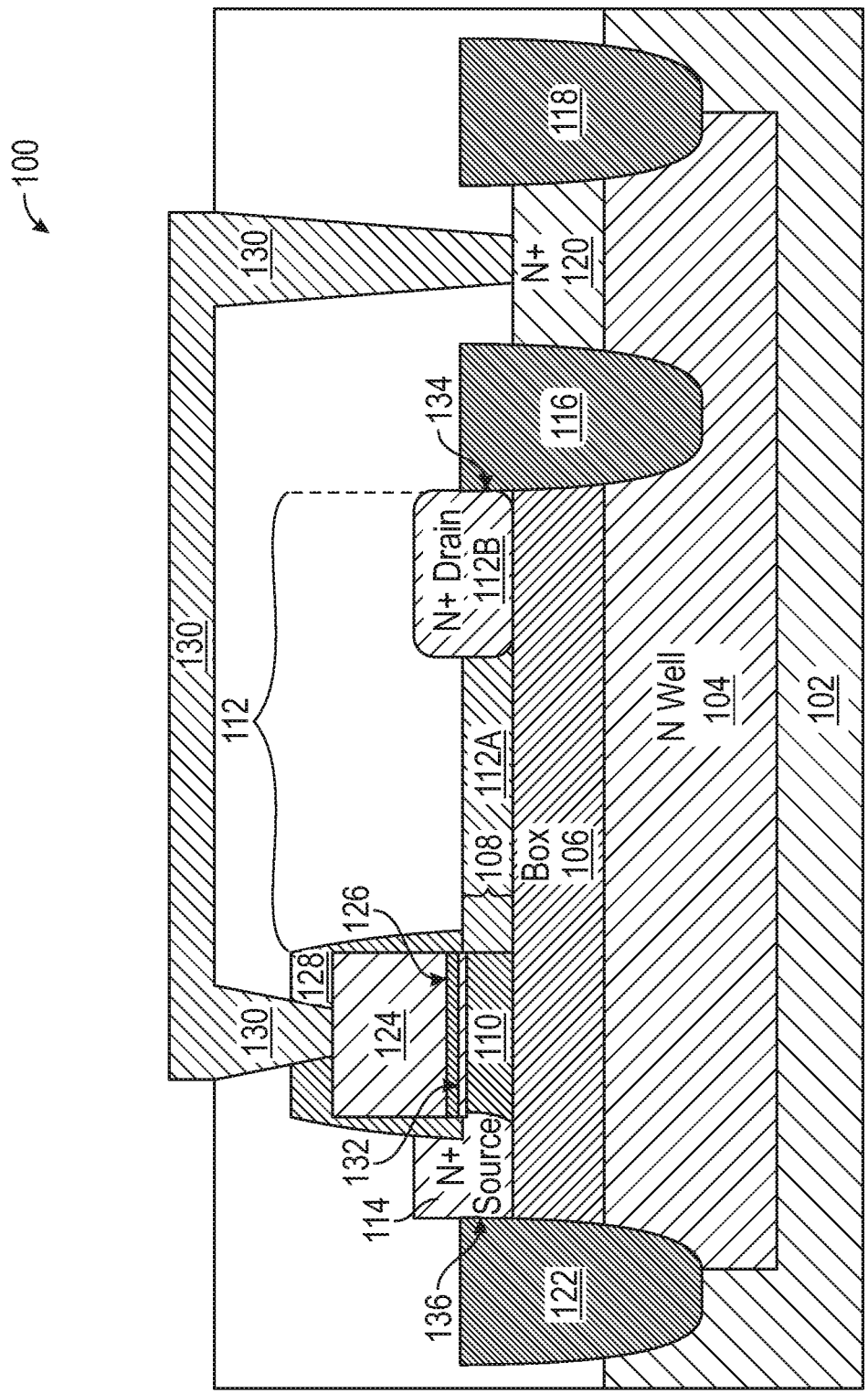
FIG. 1 illustrates an example of an LDMOS on FDSOI, according to some aspects of the disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, systems and configurations are described for providing LDMOS on FDSOI. FDSOI may be used for high performance processors because it may provide ultra-low power consumption electronics with drastically reduced leakage power. A channel of an LDMOS on FDSOI may be very thin and thus may not need to be doped. Using an un-doped channel may minimize random fluctuations in LDMOS voltage. Additionally, there is no floating body effect in an LDMOS on FDSOI and consequently it is easier to control short-channel effects. In addition, compared to bulk LDMOS, an LDMOS on FDSOI may require smaller dimensions for the same voltage level.

In one or more aspects of the subject technology, an LDMOS on FDSOI with reduced resistance in on-state is described. A drain region of the LDMOS on FDSOI may include a lightly doped segment. The lightly doped drain (LDD) segment may help prevent a gate dielectric breakdown and increase drain to source voltage, which the LDMOS can tolerate. However, the LDD segment may contribute to the on-state resistance of the LDMOS. The higher on-state resistance may become an issue when fast turn on of the LDMOS is required. To reduce the on-state resistance, or likewise, to increase the drain to source current in the on-state, the gate voltage may concurrently be applied at two locations of the LDMOS circuit. First, the gate voltage is applied to the channel to create an inversion layer in the channel. Second, the gate voltage may be applied to a semiconductor well behind the buried oxide layer to create a back bias and thus enhance the drain to source current. By enhancing the drain to source current in the on-state of the LDMOS, in effect the resistance between the drain and source in the on-state may be reduced up to 30%. Additionally, applying the gate voltage to the semiconductor well behind the buried oxide layer may have no effect on performance of the LDMOS in the off-state.

An LDMOS on FDSOI with reduced on-state resistance can be detected during failure analysis and device characteristics measurements. Because a removal of SOI in certain areas may be performed without adding to the process steps, connecting the gate voltage to the semiconductor well does not require an extra mask or process step. Additionally, the formation of the LDD segment is similar to the process that adjusts the threshold voltage of a MOSFET and thus does not require an additional process step.

FIG. 1 illustrates an example of an LDMOS on FDSOI, according to some aspects of the disclosure. LDMOS 100 includes substrate 102 and first semiconductor layer 104 where first semiconductor layer 104 is disposed on substrate 102. In some examples, first semiconductor layer 104 is an n-type diffusion layer such as an N well. LDMOS 100 includes buried oxide layer 106 (BOX layer) that is disposed on first semiconductor layer 104 and second semiconductor layer 108 that is disposed on top of buried oxide layer 106. In some examples, second semiconductor layer 108 is created by a process that begins with growing an oxide layer on top of an additional substrate. Then the additional substrate may be flipped and bonded to substrate 102. As described, substrate 102 includes semiconductor layer 104. Thus, after bonding the grown oxide layer may attach to semiconductor layer 104. A cut is made through a thickness of the additional substrate to create, on top of the grown oxide layer, a remaining semiconductor layer of the additional substrate. In some embodiments, the remaining semiconductor layer of the additional substrate is second semiconductor layer 108 and the grown oxide layer is buried oxide layer 106. Second semiconductor layer 108 may include first gate region 110, drain region 112, and source region 114. First gate region 110 may be positioned between source region 114 and drain region 112 and may have a length of 100 nm to 400 nm.

LDMOS 100 further includes first shallow trench isolation 116 that may be disposed between drain region 112 and first semiconductor layer 104. First shallow trench isolation 116 may be positioned between first end 134 of second semiconductor layer 108 and first semiconductor layer 104. First shallow trench isolation 116 may extend from second semiconductor layer 108 to first semiconductor layer 104.

Also, second gate region 120 may be disposed on first semiconductor layer 104 away from second semiconductor layer 108 and between first shallow trench isolation 116 and second shallow trench isolation 118. Second shallow trench isolation 118 may extend from second gate region 120 to first semiconductor layer 104. Additionally, gate node 130 may be coupled to first gate region 110 and second gate region 120. Gate node 130 may apply a same gate voltage to first gate region 110 and second gate region 120 such that the gate voltage may also be applied to the first semiconductor layer 104. Applying the gate voltage via second gate region 120 to first semiconductor layer 104 during an on-state of LDMOS 100 may create a back bias of first gate region 110. In some examples, the gate voltage is between 0.6 volts to 1.8 volts.

LDMOS 100 further includes third shallow trench isolation 122 that may be disposed between source region 114 and first semiconductor layer 104. Third shallow trench isolation 122 may be positioned between second end 136 of second semiconductor layer 108 and first semiconductor layer 104 (N well). Third shallow trench isolation 122 may extend from second semiconductor layer 108 to first semiconductor layer 104 to isolate source region 114 from first semiconductor layer 104.

In some examples, first shallow trench isolation 116; second shallow trench isolation 118, and third shallow trench isolation 122 are made of a dielectric material such as silicon oxide. Shallow trench isolations 118 and 122 may prevent electric current leakage between adjacent components.

In some embodiments, second semiconductor layer 108 including first gate region 110 is very thin, e.g., between 20 nm and 35 nm. First gate region 110 is not doped and is fully depleted of mobile charges. In some examples, buried oxide layer 106 is also very thin, e.g., between 10 nm and 30 nm.

In some embodiments, second semiconductor layer 108 may be created as an un-doped layer. Then in drain region 112 and source region 114 n-type dopants are deposited. In some embodiments, source region 114 is a highly doped n-type (N$^+$) semiconductor. In some embodiments, drain region 112 includes two adjacent n-type segments, first drain segment 112A and second drain segment 112B. First drain segment 112A is a lightly doped n-type segment that may be called lightly doped drain (LDD). Second drain segment 112B is N$^+$, a highly doped n-type. First drain segment 112A is in contact with first gate region 110. LDD segment is positioned between second drain segment 112B and first gate region 110 and may be used to provide a voltage drop from second drain segment 112B to an edge of first gate region 110. The voltage drop may reduce the electric field intensity in first gate region 110. By reducing the electric field intensity in first gate region 110, a gate dielectric breakdown can be prevented. Also, the N$^+$ second drain segment 112B is used for creating an ohmic contact with a drain node (not shown). The N$^+$ source region 114 may also be used for creating an ohmic contact with a source node (not shown). In some embodiments, second gate region 120 is also an N$^+$ region to create an ohmic contact with gate node 130.

In some examples, when LDMOS 100 is turned on, first drain segment 112A of drain region 112 that is lightly doped has a higher resistance than second drain segment 112B that is highly doped. Therefore, first drain segment 112A may contribute more than second drain segment 112B to the resistance between drain region 112 and source region 114 of LDMOS 100. Thus, lightly doped first drain segment 112A may increase the resistance of LDMOS 100 in the on-state.

In some embodiments, substrate 102 is not doped and first semiconductor layer 104 is a deposited N well. In some examples, substrate 102 is lightly doped p-type and first semiconductor layer 104 is an N well in the lightly doped p-type substrate.

In some embodiments, when a positive bias is applied to second gate region 120 of LDMOS 100, a positive threshold voltage of LDMOS 100 decreases. Decreasing the threshold voltage may cause a current between drain region 112 and source region 114 to increase. In some examples, when LDMOS 100 is turned on a voltage of about 1.8 volts may be applied to the gate node and the source node may be grounded.

In some embodiments, gate node 130 of LDMOS 100 couples to first gate region 110 via high dielectric constant oxide layer 132, tri-nitride layer 126, and polysilicon layer 124. In some embodiments, low dielectric constant silicon Nitride layer 128 covers the coupling. In some examples, a material of gate node 130 that couples first gate region 110 to second gate region 120 is a metal made of tungsten or cobalt. In some examples, LDMOS 100 is forward biased and a gate voltage is applied between first gate region 110 and source region 114. The gate voltage is a positive voltage above threshold voltage of LDMOS 100. Then, an inversion layer is formed in first gate region 110 that cause a current to flow from drain region 112 to source region 114. As described, applying the positive bias to second gate region 120 of LDMOS 100, may act as a back bias and thus may increase the current from drain region 112 to source region 114. In some embodiments, LDMOS 100 is reverse biased and the gate voltage of first gate region 110 is zero or a negative voltage that is applied between first gate region 110 and source region 114. In some examples, applying the negative bias to second gate region 120 of LDMOS 100 does not affect a performance of LDMOS 100 when reversed biased.

Figure 2:
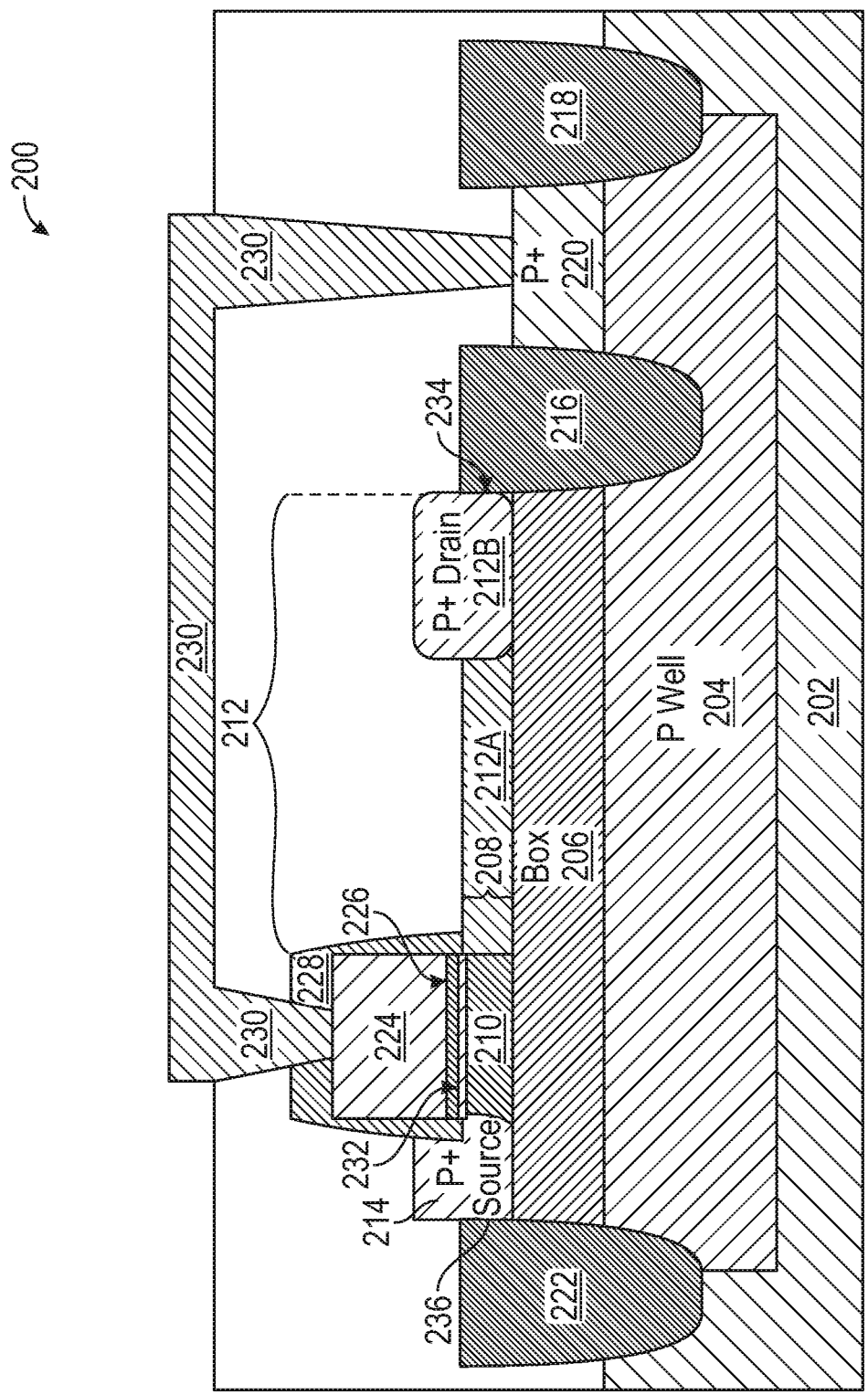
FIG. 2 illustrates an example of an LDMOS on FDSOI, according to some aspects of the disclosure.

FIG. 2 illustrates an example of an LDMOS on FDSOI, according to some aspects of the disclosure. LDMOS 200 includes substrate 202 and first semiconductor layer 204 where first semiconductor layer 204 is disposed on substrate 202. In some examples, first semiconductor layer 204 is a p-type diffusion layer such as a P well. LDMOS 200 includes buried oxide layer 206 (BOX) that is disposed on first semiconductor layer 204 and second semiconductor layer 208 that is disposed on top of buried oxide layer 206. In some examples, second semiconductor layer 208 is disposed on top of buried oxide layer 206 by a same process described above for creating second semiconductor layer 108. Second semiconductor layer 208 may include first gate region 210, drain region 212, and source region 214. First gate region 210 may be positioned between source region 214 and drain region 212.

In some embodiments, LDMOS 200 has a same structure as LDMOS 100. Additionally, in LDMOS 200 source region 214, drain region 212, and second gate region 220 as well as first semiconductor layer 204 are p-type semiconductors. Also, source region 214, second gate region 220, and second drain segment 212B are highly doped p-type (P$^+$) semiconductors. LDMOS 200 is described in more details with respect to method 300 of FIG. 3.

Additionally, gate node 230 of LDMOS 200 couples to first gate region 210 via high dielectric constant oxide layer 232, tri-nitride layer 226, and polysilicon layer 224. In some embodiments, low dielectric constant silicon Nitride layer 228 covers the coupling. In some examples, a material of gate node 230 that couples first gate region 210 to second gate region 220 is a metal made of tungsten or cobalt. In some embodiments, LDMOS 200 is forward biased and a gate voltage is applied between first gate region 210 and source region 214. The gate voltage is a negative voltage below a negative threshold voltage of LDMOS 200. Then, an inversion layer is formed in first gate region 210 that cause a current to flow between source region 214 and drain region 212. In some examples, applying the negative bias to second gate region 220 of LDMOS 200, may act as a back bias and thus may increase the current flow from source region 214 to drain region 212. In some embodiments, LDMOS 200 is reverse biased and the gate voltage of first gate region 210 is zero or a positive voltage that is applied between first gate region 210 and source region 214. In some examples, applying the positive bias to second gate region 220 of LDMOS 200, does not affect a performance of LDMOS 200 when reversed biased.

In some embodiments and returning back to FIGS. 1 and 2, the P well and the N well may have a dopant concentration of about $10^{18}$ and the N⁺ and the P⁺ regions have a dopant concentration between $5 \times 10^{19}$ and $5 \times 10^{20}$. Lightly doped first drain segments 212A and 112A may have a concentration of about $10^{18}$.

Figure 3:
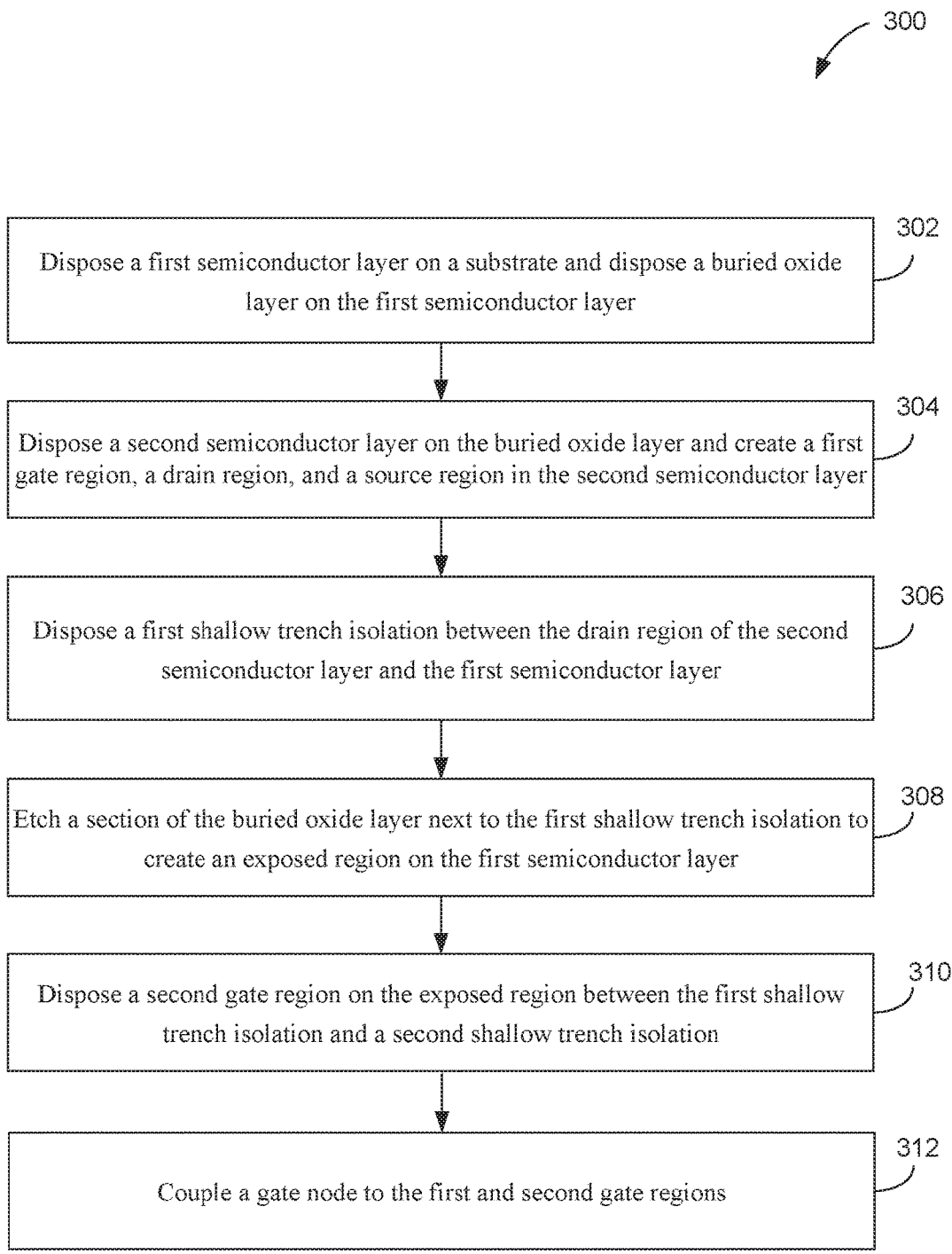
FIG. 3 illustrates a flow diagram of an example method and concept for creating an LDMOS on FDSOI, according to some aspects of the disclosure.

FIG. 3 illustrates a flow diagram of an example method and concept for creating an LDMOS on FDSOI, according to some aspects of the disclosure. Notably, one or more steps of method 300 described herein may be omitted, performed in a different sequence, and/or combined with other methods for various types of applications contemplated herein. Method 300 can be performed for creating LDMOS 100 or 200 of FIG. 1 or 2.

As show in FIG. 3, at step 302, a first semiconductor layer is disposed on a substrate. In addition, a buried oxide layer is disposed on the first semiconductor layer. Referring to FIG. 1, first semiconductor layer 104 (N well) may be disposed, e.g., created, on substrate 102 and buried oxide layer 106 may be disposed on top of first semiconductor layer 104. Referring to FIG. 2, first semiconductor layer 204 (P well) may be disposed on substrate 202 and buried oxide layer 206 may be disposed on top of first semiconductor layer 204. In some embodiments, first semiconductor layers 104 and 204 are diffused layers. In some examples, buried oxide layers 106 and 206 are very thin oxide layers between 10 nm and 30 nm.

At step 304, a second semiconductor layer is disposed on the buried oxide layer. In addition, a first gate region, a drain region, and a source region are created in the second semiconductor layer. In some embodiments as shown in FIG. 1, second semiconductor layer 108 is disposed on buried oxide layer 106. Then source region 114, first gate region 110, and drain region 112 are created in second semiconductor layer 108. In some examples, first gate region 110 is not doped, source region 114 is N⁺, and the n-type drain region 112 includes first drain segment 112A that is lightly doped and second drain segment 112B that is N⁺. In some embodiments as shown in FIG. 2, second semiconductor layer 208 is disposed on buried oxide layer 206. Then source region 214, first gate region 210, and drain region 212 are created in second semiconductor layer 208. In some examples, first gate region 210 is not doped, source region 214 is P⁺, and the p-type drain region 212 includes first drain segment 212A that is lightly doped and second drain segment 212B that is P⁺. In some embodiments and referring to FIGS. 1 and 2, second semiconductor layers 108 and 208 are not doped when created. The dopants in the source and drain regions are then deposited and annealed. In some examples, second drain segments 112B and 212B and source regions 114 and 214 are raised.

As described, buried oxide layers 106 and 206 may be created on the additional substrate and then flipped and disposed on substrates 102 and 202. Additionally, second semiconductor layers 108 and 208 may be disposed in a same process that creates buried oxide layers 106 and 206. In some other embodiments, the source, gate, and drain regions of second semiconductor layers 108 and 208 are created by ion implantation. The source, gate, and drain regions are created in the additional substrate before the additional substrate is flipped and bonded to substrates 102 and 202.

At step 306, a first shallow trench isolation is disposed between the drain region of the second semiconductor layer and the first semiconductor layer. In some embodiments as shown in FIG. 1, first shallow trench isolation 116 is disposed at first end 134 of second semiconductor layer 108. First shallow trench isolation 116 is disposed between drain region 112 of second semiconductor layer 108 and first semiconductor layer 104. First shallow trench isolation 116 is extended from drain region 112 to first semiconductor layer 104. In some embodiments as shown in FIG. 2, first shallow trench isolation 216 is disposed at first end 234 of second semiconductor layer 208. First shallow trench isolation 216 is disposed between drain region 212 of second semiconductor layer 208 and first semiconductor layer 204. First shallow trench isolation 216 is extended from drain region 212 to first semiconductor layer 204. In some examples and referring to FIGS. 1 and 2, shallow trench isolations 116 and 216 are made of silicon dioxide and have a depth of 100 nm to 200 nm. In some embodiments, buried oxide layers 106 and 206 are respectively extended beyond second semiconductor layer 108 and 208. Thus buried oxide layers 106 and 206 are etched and then the shallow trench isolations 116 and 216 are created to isolate drain regions 112 and 212 from first semiconductor layers 104 (N well) and 204 (P well). In some embodiments, shallow trench isolations 122 and 222 are similarly created at second ends 136 and 236 of second semiconductor layers 108 and 208. Shallow trench isolations 122 and 222 may isolate source regions 114 and 214 from first semiconductor layers 104 (N well) and 204 (P well). Additionally, shallow trench isolations 122 and 222 also isolate LDMOS 100 and LDMOS 200 from other LDMOS devices on substrates 102 and 202.

At step 308, a section of the buried oxide layer next to the first shallow trench isolation is etched to create an exposed region on the first semiconductor layer. As discussed above and referring to FIGS. 1 and 2, buried oxide layers 106 and 206 are respectively extended beyond second semiconductor layer 108 and 208. Thus buried oxide layers 106 and 206 may be etched to create shallow trench isolations 116 and 216. Buried oxide layers 106 and 206 may further be etched beyond shallow trench isolations 116 and 216 to create exposed second gate regions 120 and 220 on first semiconductor layers 104 and 204.

At step 310, a second gate region is disposed on the exposed region between the first shallow trench isolation and a second shallow trench isolation. Referring to FIGS. 1 and 2, second gate regions 120 and 220 are created at exposed regions of first semiconductor layers 104 and 204. Second gate regions 120 and 220 are respectively N⁺ and P⁺. In some embodiments, shallow trench isolations 118 and 218 are similarly created next to second gate regions 120 and 220. Additionally, shallow trench isolations 118 and 218 isolate LDMOS 100 and LDMOS 200 from other LDMOS devices in substrates 102 and 202.

At step 312, a gate node is coupled to the first and second gate regions. As shown in FIG. 1, gate node 130 may be coupled to first gate region 110 and second gate region 120. As discussed, gate node 130 may be coupled to second gate region 120 through an ohmic contact such that a positive gate voltage may be applied to first semiconductor layer 104 in an on-state of LDMOS 100. The positive gate voltage may create a back bias for first gate region 110 in the on-state when the gate node is positively biased with respect to source region 114. The back bias may increase a flow of current from drain region 112 to source region 114 when LDMOS 100 is forward biased. Equivalently, the back bias may decrease a resistance between the drain region and source region.

Similarly, as shown in FIG. 2, gate node 230 may be coupled to first gate region 210 and second gate region 220. Gate node 230 may be coupled to second gate region 220 through an ohmic contact such that a negative gate voltage may be applied to first semiconductor layer 204 in an on-state of LDMOS 200. The negative gate voltage may create a back bias for first gate region 210 in the on-state when the gate node is negatively biased with respect to the source region 214. The back bias may increase a flow of current from source region 214 to drain region 212 when LDMOS 200 is forward biased. Equivalently, the back bias may decrease a resistance between the drain region and source region. In some examples, by connecting the gate node to the second gate region, a resistance between the drain and source regions is reduced by 30%.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A semiconductor device, comprising:
   a substrate;
   a first semiconductor layer disposed on the substrate;
   a buried oxide layer disposed on the first semiconductor layer,
   a second semiconductor layer disposed on the buried oxide layer, wherein the second semiconductor layer comprises a first gate region, a drain region, and a source region, and wherein the first gate region is positioned between the source and the drain regions;
   a first shallow trench isolation disposed between the drain region at a first end of the second semiconductor layer and the first semiconductor layer, wherein the first shallow trench isolation is extended from the second semiconductor layer to the first semiconductor layer;
   a second gate region disposed on the first semiconductor layer away from the second semiconductor layer and between the first shallow trench isolation and a second shallow trench isolation; and
   a gate node coupled to the first gate region and the second gate region and configured to apply a gate voltage to the first gate region and the second gate region.

2. The semiconductor device of claim 1, wherein applying the gate voltage to the second gate region is configured to cause a reduction of resistance of the semiconductor device in an on-state.

3. The semiconductor device of claim 1, wherein the drain region comprises a lightly doped segment and a highly doped segment of a same dopant type, wherein the highly doped segment comprises a larger dopant concentration compared to the lightly doped segment.

4. The semiconductor device of claim 3, wherein the lightly doped segment of the drain region is positioned between the first gate region and the highly doped segment of the drain region.

5. The semiconductor device of claim 1, wherein the second semiconductor layer has a first side in contact with the buried oxide layer, and wherein the gate node, a source node, and a drain node are respectively coupled to the first gate region, the source region, and the drain region on a second side of the second semiconductor layer opposite to the first side of the second semiconductor layer.

6. The semiconductor device of claim 1, further comprising:
a third shallow trench isolation extending from the second semiconductor layer to the first semiconductor layer and disposed between the source region at a second end of the second semiconductor layer and the first semiconductor layer.

7. The semiconductor device of claim 6, wherein the first shallow trench isolation is configured to isolate the drain region from the first semiconductor layer, and wherein the second shallow trench isolation is extended from the second gate region to the first semiconductor layer, and the third shallow trench isolation is configured to isolate the source region from the first semiconductor layer.

8. The semiconductor device of claim 1, wherein the first semiconductor layer is a doped well in the substrate.

9. The semiconductor device of claim 1, wherein applying the gate voltage to the second gate region is configured to increase a magnitude of a drain to source current in an on-state.

10. The semiconductor device of claim 1, wherein the source region, the drain region, the second gate region, and the first semiconductor layer are n-type doped, and wherein first gate region in not doped.

11. The semiconductor device of claim 1, wherein the source region, the drain region, the second gate region, and the first semiconductor layer are p-type doped, and wherein first gate region in not doped.

12. A method of creating a laterally diffused MOSFET, comprising:
disposing a first semiconductor layer on a first substrate;
disposing a buried oxide layer on the first semiconductor layer;
disposing a second semiconductor layer on the buried oxide layer;
disposing a first gate region, a drain region, and a source region in the second semiconductor layer, wherein the first gate region is positioned between the source and the drain regions;
disposing a first shallow trench isolation between the drain region at a first end of the second semiconductor layer and the first semiconductor layer;
etching a section of the buried oxide layer next to the first shallow trench isolation and farther from the drain region to create an exposed region on the first semiconductor layer;
disposing a second gate region on the exposed region of the first semiconductor layer between the first shallow trench isolation and a second shallow trench isolation; and
coupling a gate node to the first gate region and the second gate region.

13. The method of claim 12, wherein the gate node is configured to apply a gate voltage to the first gate region and the second gate region, and wherein applying the gate voltage to the second gate region is configured to cause a reduction of a resistance of the laterally diffused MOSFET in an on-state.

14. The method of claim 12, further comprising:
extending the first shallow trench isolation from the second semiconductor layer to the first semiconductor layer; and
isolating the drain region from the first semiconductor layer by the first shallow trench isolation.

15. The method of claim 12, wherein the drain region comprises a lightly doped segment and a highly doped segment of a same dopant type, wherein the highly doped segment comprises a larger dopant concentration compared to the lightly doped segment.

16. The method of claim 15, further comprising:
arranging the lightly doped segment of the drain region between the first gate region and the highly doped segment of the drain region.

17. The method of claim 12, wherein the disposing the buried oxide layer and the disposing the second semiconductor layer further comprise:
growing an oxide layer on a second substrate;
flipping and bonding the second substrate to the first substrate, wherein after bonding the oxide layer is attached to the first semiconductor layer of the first substrate; and
making a cut through a thickness of the second substrate to create, on top of oxide layer, a remaining semiconductor layer, wherein the oxide layer is the buried oxide layer and the remaining semiconductor layer is the second semiconductor layer.

18. The method of claim 12, further comprising:
disposing a third shallow trench isolation between the source region at a second end of the second semiconductor layer and the first semiconductor layer;
extending the third shallow trench isolation from the second semiconductor layer to the first semiconductor layer; and
isolating the source region from the first semiconductor layer by the third shallow trench isolation.

19. The method of claim 12, further comprising:
extending the second shallow trench isolation from the second gate region to the first semiconductor layer.

20. A method of operating a laterally diffused n-type MOSFET, the laterally diffused n-type MOSFET including a first gate region, a second gate region, a source region, and a drain region, the method comprising:
applying a positive gate voltage above a predetermined threshold voltage to the first gate region and the second gate region, wherein the second gate region is disposed on an exposed region of a first semiconductor layer between a first shallow trench isolation and a second shallow trench isolation, the first shallow trench isolation being between the drain region at a first end of a second semiconductor layer and the first semiconductor layer disposed beneath the second semiconductor layer;
generating an inversion layer in the first gate region based on the applied gate voltage to the first gate region;
generating a back bias based on the applied gate voltage to the second gate region; and
generating a current flow from the drain region to the source region, wherein the current flow is generated based at least on the inversion layer and the back bias.

* * * * *